United States Patent
Cho

(10) Patent No.: US 10,120,033 B2
(45) Date of Patent: Nov. 6, 2018

(54) BATTERY SENSOR AND BATTERY MONITORING SYSTEM

(71) Applicant: HYUNDAI MOBIS CO., LTD, Seoul (KR)

(72) Inventor: Tae Sun Cho, Yongin-si (KR)

(73) Assignee: Hyundai Mobis Co., Ltd., Seoul (KR)

(*) Notice: Subject to any disclaimer, the term of this patent is extended or adjusted under 35 U.S.C. 154(b) by 381 days.

(21) Appl. No.: 14/841,872

(22) Filed: Sep. 1, 2015

(65) Prior Publication Data

US 2016/0061906 A1    Mar. 3, 2016

(30) Foreign Application Priority Data

Sep. 2, 2014  (KR) .................. 10-2014-0116295

(51) Int. Cl.
| | |
|---|---|
| *G01R 31/36* | (2006.01) |
| *B60R 16/033* | (2006.01) |
| *H02J 7/00* | (2006.01) |

(52) U.S. Cl.
CPC ........ *G01R 31/3658* (2013.01); *B60R 16/033* (2013.01); *G01R 31/3624* (2013.01); *H02J 7/0021* (2013.01); *Y02T 10/7055* (2013.01)

(58) Field of Classification Search
None
See application file for complete search history.

(56) References Cited

U.S. PATENT DOCUMENTS

| | | |
|---|---|---|
| 8,350,529 B2 | 1/2013 | Loncarevic |
| 9,647,466 B2 | 5/2017 | Kubo et al. |
| 2003/0094954 A1 | 5/2003 | Mashiko |

(Continued)

FOREIGN PATENT DOCUMENTS

| | | |
|---|---|---|
| CN | 1420362 A | 5/2003 |
| CN | 1790857 A | 6/2006 |

(Continued)

OTHER PUBLICATIONS

Tae-Seon Cho, Battery sensor and battery monitoring system; Hyundai Mobis Col. Ltd., Publication date: Jun. 20, 2013, G01R31/36.*

(Continued)

*Primary Examiner* — Melissa Koval
*Assistant Examiner* — Nasima Monsur
(74) *Attorney, Agent, or Firm* — NSIP Law

(57) ABSTRACT

A battery monitoring system includes a battery sensor mounted between a plurality of batteries in a battery system for a vehicle using the plurality of batteries. The battery sensor according to an aspect of the present invention, which uses an ammeter resistor connected in series between a first battery and a second battery, includes: a first integrated circuit configured to receive voltages of both electrodes of the first battery and voltages of both terminals of the ammeter resistor to measure a first battery voltage and a one-directional current of the first and second batteries; and a second integrated circuit configured to receive voltages of both electrodes of the second battery to measure a second battery voltage, and receive the first battery voltage and the one-directional current of the first and second batteries from the first integrated circuit through a serial communication interface.

11 Claims, 2 Drawing Sheets

(56) References Cited

U.S. PATENT DOCUMENTS

| | | | |
|---|---|---|---|
| 2006/0139008 A1 | 6/2006 | Park | |
| 2008/0238432 A1* | 10/2008 | Botker | G01R 31/3658 |
| | | | 324/434 |
| 2010/0001737 A1* | 1/2010 | Kubo | B60L 11/18 |
| | | | 324/434 |
| 2010/0052615 A1 | 3/2010 | Loncarevic | |
| 2010/0271036 A1* | 10/2010 | Kishimoto | B60L 11/1855 |
| | | | 324/434 |
| 2011/0101918 A1 | 5/2011 | Tsukamoto et al. | |
| 2013/0207613 A1 | 8/2013 | Loncarevic | |
| 2017/0214254 A1 | 7/2017 | Kubo et al. | |

FOREIGN PATENT DOCUMENTS

| | | |
|---|---|---|
| CN | 101621131 A | 1/2010 |
| CN | 101663592 A | 3/2010 |
| CN | 102749586 A | 10/2012 |
| CN | 103163471 A | 6/2013 |
| JP | 2011-97772 A | 5/2011 |
| WO | WO 2008/055505 A1 | 5/2008 |

OTHER PUBLICATIONS

Chinese Office Action dated Sep. 13, 2017 in counterpart Chinese Patent Application No. 201510543100.3 (9 pages, in Chinese).
Chinese Office Action dated May 21, 2018 in corresponding Chinese Application No. 201510543100.3 (10 pages in Chinese).
Examination Report dated Jul. 20, 2018 in corresponding German Patent Application No. 102015216534.5 (12 pages in German).

* cited by examiner

BATTERY SENSOR AND BATTERY MONITORING SYSTEM

CROSS-REFERENCE TO RELATED APPLICATIONS

This application claims priority under 35 U.S.C. § 119 to Korean Patent Application No. 10-2014-0116295, filed on Sep. 2, 2014, in the Korean Intellectual Property Office, the disclosure of which is incorporated herein by reference in its entirety.

TECHNICAL FIELD

The present invention relates to a battery sensor, and more particularly, to a battery monitoring system in which a battery sensor is mounted between a plurality of batteries in a battery system for a vehicle using the plurality of batteries.

BACKGROUND

In recent years, the number of vehicles using a voltage higher than 12 V, such as hybrid vehicles, is increasing. For example, a vehicle using a 12 V multiple voltage uses several batteries that each have 12 V and are connected in series.

Since the vehicle may secure a normal operation only when a battery voltage is within a predetermined range, the vehicle controls battery charging and monitors whether the battery has a problem by detecting a voltage, a current, and a temperature of the battery by an intelligent battery sensor (IBS).

The IBS for detecting a 12 V multiple voltage battery according to the related art may only measure a total voltage of the batteries by monitoring a battery voltage of 24 V using one 12 V dedicated application specific integrated circuit (ASIC), but may not detect a voltage imbalance between the batteries.

FIG. 1 illustrates a battery monitoring system to which a battery sensor for monitoring a voltage of 24 V is applied according to the related art.

Referring to FIG. 1, the battery sensor according to the related art includes a voltage dividing resistor Rd, an ammeter resistor Rs, a first integrated circuit IC1, and a second integrated circuit IC2.

Here, the battery sensor is mounted between a second battery and a ground of a vehicle. That is, the ammeter resistor Rs is connected in series between a negative electrode of the second battery and the ground of the vehicle.

The first integrated circuit IC1 measures a total voltage of both terminals of the first battery and both terminals of the second battery and measures a one-directional current flowing in the first battery and the second battery based on values obtained by measuring voltages applied to both terminals of the ammeter resistor Rs.

The second integrated circuit IC2 measures a voltage of the second battery and measures the other-directional current flowing in the first battery and the second battery based on values obtained by measuring voltages applied to both terminals of the ammeter resistor Rs.

The voltage of the first battery is calculated by subtracting the voltage of the second battery measured by the second integrated circuit IC2 from the total voltage measured by the first integrated circuit IC1.

Meanwhile, the battery sensor according to the related art is available only when being mounted between the battery and the ground of the vehicle. In this case, a length, a direction, and the like of a ground cable of the vehicle are varied depending on a kind of vehicle, and therefore it is difficult to share a battery sensor.

SUMMARY

An exemplary embodiment of the present invention provides a battery sensor which uses an ammeter resistor connected in series between a first battery and a second battery, the sensor including: a first integrated circuit configured to receive voltages of both electrodes of the first battery and voltages of both terminals of the ammeter resistor to measure a first battery voltage of the first battery and a one-directional current of the first and second batteries; and a second integrated circuit configured to receive voltages of both electrodes of the second battery to measure a second battery voltage, and receive the first battery voltage and the one-directional current of the first and second batteries from the first integrated circuit through a serial communication interface.

The first integrated circuit may include a first voltage sensing module configured to measure the voltages of both electrodes of the first battery; and a first current sensing module configured to measure the one-directional current of the first and second batteries.

In this case, a first electrode of the first battery may be electrically connected to the first voltage sensing module, and a second electrode of the first battery may be electrically connected to a first ground.

The first current sensing module may receive voltages of both terminals of the ammeter resistor to measure the one-directional current of the first and second batteries.

The second integrated circuit may include a second voltage sensing module electrically connected to a first electrode of the second battery to receive the voltages of both electrodes of the second battery, and a second electrode of the second battery may be electrically connected to a second ground.

The battery sensor may further include: a transceiver electrically connected to the second integrated circuit and configured to transmit the first battery voltage and the one-directional current of the first and second batteries, which are transmitted from the first integrated circuit, and the second battery voltage through a vehicle network to a master electronic control unit (ECU) for monitoring the first and second batteries.

The first and second integrated circuits may include temperature sensors configured to measure temperatures of the first and second batteries, respectively.

The serial communication interface may include an isolator configured to permit a signal transmission in a forward direction from the first integrated circuit to the second integrated circuit and block a signal transmission in a backward direction from the second integrated circuit to the first integrated circuit.

Another exemplary embodiment of the present invention provides a battery monitoring system which monitors a first battery and a second battery connected to a negative electrode of the first battery in series, the system including: an ammeter resistor connected in series between the negative electrode of the first battery and a positive electrode of the second battery; a first integrated circuit configured to detect a first battery voltage outputted from the positive electrode of the first battery, a one-directional current of the first and second batteries, and a temperature of the first battery; a second integrated circuit configured to detect a voltage of the second battery and a temperature of the second battery;

and a master ECU connected to the second integrated circuit through a vehicle network and configured to receive the first battery voltage, the second battery voltage, the one-directional current of the first and second batteries, and the temperatures of the first and second batteries through the vehicle network, and control charging of the first and second batteries and confirm whether the first and second batteries have a problem based on the received first battery voltage, second battery voltage, one-directional current of the first and second batteries, and temperatures of the first and second batteries.

The master ECU may warn of the problem of at least one battery when at least one of the first battery voltage and the second battery voltage is out of a predetermined critical range.

The battery monitoring system may further include a serial communication interface for communication connection between the first integrated circuit and the second integrated circuit, in which the serial communication interface includes an isolator configured to permit a signal transmission in a forward direction from the first integrated circuit to the second integrated circuit and block a signal transmission in a backward direction from the second integrated circuit to the first integrated circuit.

In this case, the first battery voltage, the one-directional current of the first and second batteries, and the temperature of the first battery, which are measured by the first integrated circuit, may be transmitted to the second integrated circuit through the serial communication interface.

In this case, a positive electrode of the first battery may be electrically connected to a voltage sensing module of the first integrated circuit, and a negative electrode of the first battery may be electrically connected to a first ground, and a positive electrode of the second battery may be electrically connected to a voltage sensing module of the second integrated circuit, and a negative electrode of the second battery may be electrically connected to a second ground.

DETAILED DESCRIPTION OF EMBODIMENTS

Figure 1:
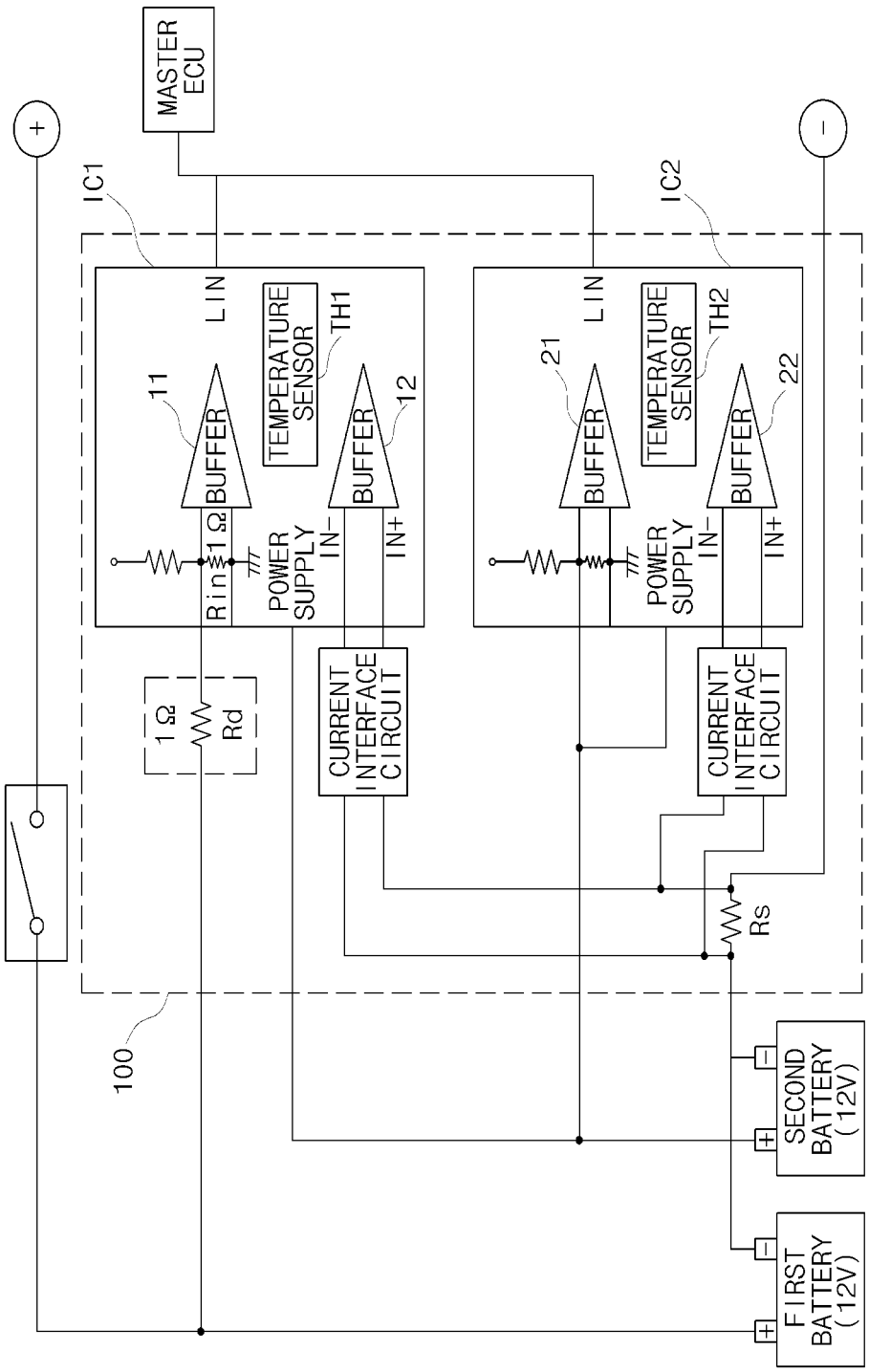
FIG. 1 is a view illustrating a battery monitoring system to which a battery sensor for monitoring a voltage of 24 V is applied according to the related art.

Hereinafter, exemplary embodiments will be described in detail with reference to the accompanying drawings. Throughout the drawings and the detailed description, unless otherwise described, the same drawing reference numerals will be understood to refer to the same elements, features, and structures. The relative size and depiction of these elements may be exaggerated for clarity, illustration, and convenience. The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Advantages and characteristics of the present invention and methods of achieving the advantages and characteristics will be apparent by referring to exemplary embodiments described below in detail together with the accompanying drawings. However, the present invention is not limited to the exemplary embodiments set forth below but may be embodied in other various forms. On the contrary, the exemplary embodiments are set forth to make the disclosure of the present invention complete and provide a thorough understanding of the scope of the invention to those skilled in the art, and the present invention will be defined only by the scope of the claims. Meanwhile, terms used in the specification are used to explain the exemplary embodiments rather than limiting the present invention. Unless particularly stated otherwise in the present specification, a singular form also includes a plural form. As used herein, the word "comprises" and/or "comprising" will be understood to imply the inclusion of stated constituent elements, steps, operations, and/or devices but not the exclusion of the presence or addition of one or more other constituent elements, steps, operations, and/or devices.

The present invention relates to a battery sensor for monitoring a 12 multiple battery voltage. Hereinafter, in the present specification, for ease of description, a battery sensor for monitoring a battery voltage of 24 V will be described.

Figure 2:
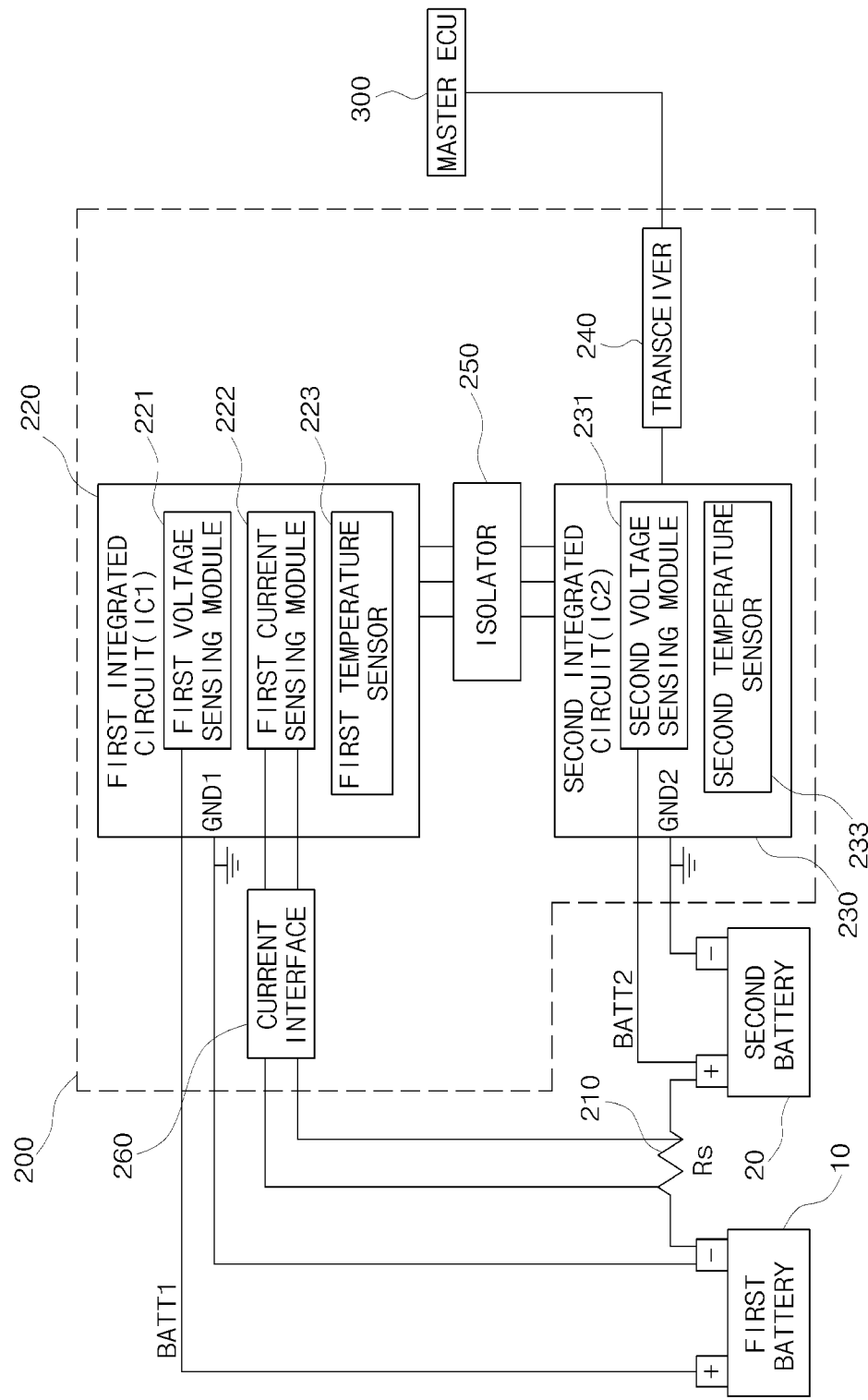
FIG. 2 is a view illustrating a battery monitoring system to which a battery sensor for monitoring a voltage of 24 V is applied according to an exemplary embodiment of the present invention.

Hereinafter, an exemplary embodiment of the present invention will be described in detail with reference to the accompanying drawings. FIG. 2 illustrates a battery monitoring system to which a battery sensor for monitoring a voltage of 24 V is applied according to an exemplary embodiment of the present invention.

As illustrated in FIG. 2, a battery sensor 200 for monitoring a voltage of 24 V according to the exemplary embodiment of the present invention uses an ammeter resistor Rs 210 connected in series between a first battery 10 and a second battery 20 and includes a first integrated circuit IC1 220 and a second integrated circuit IC2 230.

The ammeter resistor 210 is a shunt resistor connected in series between a negative electrode of the first battery 10 and a positive electrode of the second battery 20 and has a very low resistance value (for example, 100 μΩ). The first integrated circuit 220 measures a battery current based on voltages of both terminals of the ammeter resistor 210.

The first integrated circuit 220 measures a first battery voltage of the first battery 10, a one-directional current of the first and second batteries 10 and 20, and a temperature of the first battery 10.

The first integrated circuit 220 includes a first voltage sensing module 221, a first current sensing module 222, and a first temperature sensor 223, and may be an application specific integrated circuit (ASIC).

The first voltage sensing module 221 measures voltages of both electrodes of the first battery 10. Here, a first electrode of the first battery 10 is electrically connected to the first voltage sensing module 221, and a second electrode of the first battery 10 is electrically connected to a first ground GND 1.

For example, a positive electrode of the first battery 10 is electrically connected to the first voltage sensing module 221 and a negative electrode of the first battery 10 is electrically connected to the first ground GND, such that the first voltage sensing module 221 measures the voltages of both electrodes of the first battery 10.

The first current sensing module 222 receives the voltages of both terminals of the ammeter resistor 210 to measure a one-directional current of the first and second batteries. For example, the first current sensing module 222 may receive one terminal of the ammeter resistor 210 as IN− and the other terminal of the ammeter resistor 210 as IN+.

The first temperature sensor 223 measures the temperature of the first battery 10.

The second integrated circuit 230 measures a second battery voltage of the second battery 20 and transmits the first battery voltage, the one-directional current of the first battery and the second battery, and the temperature of the first battery, which are transmitted from the first integrated circuit 220, along with the second battery voltage to a master electronic control unit (ECU) 300 through an in-vehicle network.

The second integrated circuit 230 includes a second voltage sensing module 231 and a second temperature sensor 233, and may be an ASIC like the first integrated circuit 220.

The second voltage sensing module 231 measures voltages of both electrodes of the second battery 20. Here, a first electrode of the second battery 20 is electrically connected to the second voltage sensing module 231 and a second electrode of the second battery 20 is electrically connected to a second ground GND 2.

For example, a positive electrode of the second battery 20 is electrically connected to the second voltage sensing module 231 and a negative electrode of the second battery 20 is electrically connected to the second ground GND 2, such that the second voltage sensing module 231 measures voltages of both electrodes of the second battery 20.

The second temperature sensor 233 measures a temperature of the second battery 20.

Meanwhile, the battery sensor 200 according to the exemplary embodiment of the present invention may further include a transceiver 240 for transmitting the first and second battery voltages, the one-directional current of the first battery 10 and the second battery 20, and the temperatures of the first and second batteries, which are measured by the first integrated circuit 220 and the second integrated circuit 230, to the master ECU 300 through the in-vehicle network.

According to the exemplary embodiment of the present invention, the transceiver 240 is electrically connected to the second integrated circuit 230, and the second integrated circuit 230 transmits the measurement values transmitted from the first integrated circuit 220, along with the measurement values obtained by the second integrated circuit 230, to the master ECU 300 through the transceiver 240.

To this end, the first integrated circuit 220 and the second integrated circuit 230 may be communication-connected through a serial communication interface. For example, the first integrated circuit 220 and the second integrated circuit 230 may be communication-connected through a serial peripheral interface bus.

In this case, the serial communication interface may include an isolator 250 which permits a signal transmission in a forward direction from the first integrated circuit 220 to the second integrated circuit 230 and blocks a signal transmission in a backward direction from the second integrated circuit 230 to the first integrated circuit 220.

The master ECU 300 checks the first battery voltage, the one-directional current of the first and the second batteries, and the temperatures of the first and second batteries, which are transmitted from the second integrated circuit 230, and correspondingly controls battery charging or monitors whether each of the batteries has a problem.

The master ECU 300 checks the first battery voltage and the second battery voltage to confirm a voltage imbalance between the batteries. In this case, when at least one of the first battery voltage and the second battery voltage is out of a predetermined critical range, the master ECU 300 may warn of the fact that at least one battery has a problem.

Since the present invention monitors the battery by using a plurality of ASICs, when one ASIC is damaged, the other ASICs may perform a function of diagnosing an error of the battery, thereby preventing a dangerous situation such as restart failure due to a diagnosis error of the battery sensor while using an idle stop & go (ISG) function.

According to the present invention, the battery sensor is electrically connected between the plurality of batteries, such that the plurality of batteries may share the battery sensor regardless of a length and a direction of a ground cable of a vehicle.

A voltage imbalance between the batteries due to a state of charge and a state of health of the battery may be identified by checking voltages and temperatures of the plurality of batteries, thereby warning to and taking measures to preferentially replace only one of the plurality of batteries.

The present invention monitors the battery by using the plurality of ASICs, such that when one ASIC is damaged, the other ASICs may perform a function of diagnosing an error of the battery, thereby preventing a dangerous situation such as restart failure due to a diagnosis error of the battery sensor while using the idle stop & go (ISG) function.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A battery sensor which uses an ammeter resistor connected in series between a first battery and a second battery, the sensor comprising:
    a first integrated circuit configured to receive voltages of both electrodes of the first battery and voltages of both terminals of the ammeter resistor to measure a first battery voltage of the first battery and a one-directional current of the first and second batteries;
    a second integrated circuit configured to receive voltages of both electrodes of the second battery to measure a second battery voltage, and receive the first battery voltage and the one-directional current of the first and second batteries from the first integrated circuit through a serial communication interface; and
    a transceiver electrically connected to the second integrated circuit and configured to transmit the first battery voltage and the one-directional current of the first and second batteries, which are transmitted from the first integrated circuit, and the second battery voltage through a vehicle network to a master electronic control unit (ECU) for monitoring the first and second batteries.

2. The sensor of claim 1, wherein the first integrated circuit includes:
    a first voltage sensing module configured to measure the voltages of both electrodes of the first battery; and
    a first current sensing module configured to measure the one-directional current of the first and second batteries.

3. The sensor of claim 2, wherein a first electrode of the first battery is electrically connected to the first voltage sensing module, and a second electrode of the first battery is electrically connected to a first ground.

4. The sensor of claim 2, wherein the first current sensing module receives voltages of both terminals of the ammeter resistor to measure the one-directional current of the first and second batteries.

5. The sensor of claim 1, wherein the second integrated circuit includes a second voltage sensing module electrically connected to a first electrode of the second battery to receive the voltages of both electrodes of the second battery, and a second electrode of the second battery is electrically connected to a second ground.

6. The sensor of claim 1, wherein the first and second integrated circuits include temperature sensors configured to measure temperatures of the first and second batteries, respectively.

7. The sensor of claim 1, wherein the serial communication interface includes an isolator configured to permit a signal transmission in a forward direction from the first integrated circuit to the second integrated circuit and block a signal transmission in a backward direction from the second integrated circuit to the first integrated circuit.

8. A battery monitoring system which monitors a first battery and a second battery connected to a negative electrode of the first battery in series, the system comprising:
an ammeter resistor connected in series between the negative electrode of the first battery and a positive electrode of the second battery;
a first integrated circuit configured to detect a first battery voltage outputted from the positive electrode of the first battery, a one-directional current of the first and second batteries, and a temperature of the first battery;
a second integrated circuit configured to detect a voltage of the second battery and a temperature of the second battery;
a master ECU connected to the second integrated circuit through a vehicle network and configured to receive the first battery voltage, the second battery voltage, the one-directional current of the first and second batteries, and the temperatures of the first and second batteries through the vehicle network, and control charging of the first and second batteries and confirm whether the first and second batteries have a problem based on the received first battery voltage, second battery voltage, one-directional current of the first and second batteries, and temperatures of the first and second batteries; and
a serial communication interface for communication connection between the first integrated circuit and the second integrated circuit,
wherein the serial communication interface includes an isolator configured to permit a signal transmission in a forward direction from the first integrated circuit to the second integrated circuit and block a signal transmission in a backward direction from the second integrated circuit to the first integrated circuit.

9. The system of claim 8, wherein the master ECU warns of the problem of at least one battery when at least one of the first battery voltage and the second battery voltage is out of a predetermined critical range.

10. The system of claim 8, wherein
the first battery voltage, the one-directional current of the first and second batteries, and the temperature of the first battery, which are measured by the first integrated circuit, are transmitted to the second integrated circuit through the serial communication interface.

11. The system of claim 8, wherein a positive electrode of the first battery is electrically connected to a voltage sensing module of the first integrated circuit, and a negative electrode of the first battery is electrically connected to a first ground, and
a positive electrode of the second battery is electrically connected to a voltage sensing module of the second integrated circuit, and a negative electrode of the second battery is electrically connected to a second ground.

* * * * *